United States Patent
Maeda

(10) Patent No.: US 7,064,991 B2
(45) Date of Patent: Jun. 20, 2006

(54) SEMICONDUCTOR STORAGE DEVICE

(75) Inventor: Kazunori Maeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 106 days.

(21) Appl. No.: 10/913,371

(22) Filed: Aug. 9, 2004

(65) Prior Publication Data

US 2005/0041493 A1 Feb. 24, 2005

(30) Foreign Application Priority Data

Aug. 7, 2003 (JP) ............................. 2003-288988

(51) Int. Cl.
*G11C 29/00* (2006.01)
*G11C 7/00* (2006.01)
(52) U.S. Cl. ................. 365/201; 365/230.03
(58) Field of Classification Search ............ 365/201 O, 365/230.03 X
See application file for complete search history.

(56) References Cited

U.S. PATENT DOCUMENTS 6,134,145 A * 10/2000 Wong .................... 365/185.22
6,636,448 B1 * 10/2003 Koshikawa ................ 365/201

FOREIGN PATENT DOCUMENTS

JP 11-45599 2/1999
JP 11-242632 9/1999

OTHER PUBLICATIONS

"Method for Using SDRAM", Chapter 7, Basic Operation Mode, p. 56-60, Internet, Aug. 4, 2003, Elpida Memory <URL>http.//www.elpida.com/pdfs/JO123N50.pdf.

* cited by examiner

*Primary Examiner*—VanThu Nguyen
(74) *Attorney, Agent, or Firm*—McGinn IP Law Group, PLLC

(57) ABSTRACT

A semiconductor storage device includes command decoder for decoding an input command to output a decoded result and for simultaneously outputting A and B bank activation signal for activating said first and second banks, during a parallel test; a set of bank A control circuits for generating a control signal for a bank A based on a bank A activating signal, a selector circuit receiving a bank B activation signal output from the command decoder and the control signal for a bank A, for selecting outputting a bank B activating signal during the normal operation and for selecting and outputting the control signal for a bank A during parallel test, and a set of bank B control circuits receiving the output from the selector circuit to generate a control signal for the bank B.

15 Claims, 4 Drawing Sheets

SEMICONDUCTOR STORAGE DEVICE

FIELD OF THE INVENTION

This invention relates to a semiconductor storage device and, more particularly, to a semiconductor storage device having a structure contributing to improvement in the reliability of a parallel test.

BACKGROUND OF THE INVENTION

With the progress in the art of miniaturization process and the resulting increase in the storage capacity of the semiconductor storage device, the test time of the semiconductor storage device by a tester or the like, is increasing to raise costs in the test and hence in those in products. For shortening the test time of the semiconductor storage device, use of parallel test is taken to be effective. The schematics of the typical conventional parallel test are hereinafter described. In case of a semiconductor storage device, having e.g. a four-bank structure, the device is tested by activation on the bank basis, in the normal operation (normal testing). In the parallel test, when a given bank is activated, the totality of the banks in the semiconductor storage device are activated simultaneously. The write test (WRITE) and read test (READ) are carried out in this state to achieve the shortening of the test time.

In case the semiconductor storage device is tested using a tester, the maximum test frequency of which is low, testing the device by activation on the bank basis leads to prolonged test time because of the low test frequency. For this reason, the parallel test is used.

For testing the semiconductor memory, having plural banks, reference may be made to the description of the Patent document 1, cited below. In this Patent document 1, the testing and the interleaving bank control for a semiconductor storage device, which includes a command decoder, a control signal latch circuit for each bank, a mode register, a test mode decoder and a test mode decision circuit, and also includes a memory cell array, an X decoder, a Y decoder and a sense amplifier, is disclosed. In the Patent document 2, cited below, there is disclosed a memory device in which, when the writing operation is carried out in parallel on plural flash memories, the timing of applying the write voltage is offset from one flash memory to another to reduce the peak of the write current produced in parallel writing in the plural flash memories and hence the write time by write interleaving.

FIG. 3 is a diagram showing the configuration of a conventional semiconductor storage device during parallel test. Specifically, FIG. 3 schematically depicts, in a block diagram, a typical circuit configuration of a conventional semiconductor storage device, which has a plural number of banks, a command decoder circuit, and a circuit for generating control signals associated with the respective banks, as disclosed in the Patent document 1, recited below. FIG. 4 depicts a waveform diagram for illustrating the operation of the conventional semiconductor storage device during the parallel test.

In FIG. 3, a command decoder 301 receives a clock signal CLK and a plural number of command signals (a set of external command signals) supplied from outside the semiconductor storage device, and decodes the command signals to generate internal control signals.

Among command signals, entered to a command decoder 301, in e.g. a clock synchronization type SDRAM (synchronous DRAM) or a DDR (double data rate SDRAM), there are, for examples, bank-active (ACT), read (READ), write (WRITE), pre-charge (PRE; pre-charging of a selected bank), mode register setting (MRS) and auto-refresh (REF). The write operation is executed on receipt of a write command in the ROW active state. That is, a ROW address bank active command (ACT) is entered to activate a bank in interest (activate a specified ROW address), a write command (WRITE) and a column address (COLUMN) are supplied after a certain time as from the input of the bank active command, and data is written in an address specified in accordance with the burst length as set in a mode register, not shown. A pre-charge command then is entered and subsequently the bank is in an idle state. The read operation is executed on receipt of the read command in the row active state. That is, the ROW address and the bank active command (ACT) are entered to activate the bank (that is, activate the particular ROW address). After a preset time as from the input of the bank active command, the read command (READ) and the column address are entered, and read data of the address specified in accordance with a preset burst length and the CAS latency is output. Subsequently, a pre-charge command (PRE) is entered and the bank in interest is then in an idle state.

The circuit block 302A and 302B are control blocks which receive respectively bank activating signals ACTA and ACTB, output from the command decoder 301 and generate respectively strobe signals RASBA and RASBB for activating internal ROW systems of the two banks. The circuit block 302B is a control block for the bank B, corresponding to the circuit block 302A for the bank A.

Circuit blocks 303A and 305A are control blocks which receive the RASBA signal for activating the bank A and generate control signals needed in the ROW system. Among needed control signals, there are e.g. a signal controlling an X-address (one-shot pulse signal controlling the activation period of the selected word line) and a signal controlling an X redundancy circuit, not shown. The circuit block 305A controls the time for securing a restore level in a memory cell, not shown (the amount of electric charge held in a cell). The signal output from the circuit block 305A is RTOA.

With the circuit block 303A being an X-address control block, the circuit block 304A is a circuit block receiving the X-address to select a word line of the associated bank.

Circuit blocks 303B and 305B are control blocks which receive the RASBA signal for activating the bank B and generate control signals needed in the ROW system. Among needed control signals, there are e.g. a signal controlling an X-address (one-shot pulse signal controlling the activation period of the selected word line) and a signal controlling the X redundancy circuit, not shown. The circuit block 305B controls the time for securing a restore level (the amount of electric charge held in a cell) in a memory cell, not shown. The signal output from the circuit block 305A is RTOA.

The circuit block 303B is an X-address control block and the circuit block 304B is a circuit block receiving the X-address to select a word line.

If an external signal is supplied to the semiconductor storage device for activating the bank A during the normal operation (normal operation other than the test operation and normal testing other than the parallel test), the command decoder 301 generates the A bank activating signal ACTA, while the circuit block 302A receives the A bank activating signal ACTA to generate the strobe signal RASBA for driving the ROW system circuit for the bank A. The strobe signal RASBA becomes an input to a variety of ROW system control blocks.

If an external signal is supplied for activating the bank B, the command decoder 301 generates the B bank activating signal ACTB, while there is generated the strobe signal RASBB for driving the ROW system circuit for the associated bank.

If, in the configuration shown in FIG. 3, a bank active command (ACT) for an arbitrary bank is entered during parallel test from outside, the command decoder 301 simultaneously generates bank activation signals ACTA and ACTB, in synchronization with the rising edge of the external clock signal CLK, for activating the totality of the banks, here the bank A and the bank B. The strobe signals RASBA and RASBB (which are active at a low level) for driving the ROW system circuits for the banks A and B, are generated, based on the bank activation signals ACTA and ACTB, such that the activation of the bank A and that of the bank B start simultaneously. The test time may be made shorter by this structure.

[Patent Document 1]
Japanese Patent Kokai Publication No.JP-A-11-45599 (pages 5 and 6, FIG. 2)

[Patent Document 2]
Japanese Patent Kokai Publication No.JP-A-11-242632 (pages 3 to 6, FIGS. 1 and 3)

[Non-Patent Document 1]
'Method for Using SDRAM', chapter 7, Basic Operation Mode, pages 56 to 60, Internet (retrieved on Aug. 4, 2003), Elpida Memory <URL>http.//WWW.elpida.com/pdfs/JO123N50.pdf

SUMMARY OF THE DISCLOSURE

The conventional semiconductor storage device, as shown in FIG. 3, is of a circuit structure which allows parallel test to be carried out easily, as described above. However, in the parallel test, since plural banks are activated simultaneously, current concentration or noises tend to be problematical. That is, in the conventional structure, shown in FIG. 3, the design specifications are not such as to allow the external input activating the bank A, and the external input activating the bank B, to be input simultaneously, insofar as the normal operation is concerned. Hence, the timing for starting the activation of the bank A necessarily differs from the timing for starting the activation of the bank B. However, during the parallel test, the timing for starting the activation of the bank A coincides with the timing for starting the activation of the bank B, as a result of which current concentration or noises, that can never be generated during the normal operation, are generated during the parallel test.

Thus, in the conventional semiconductor storage device, the parallel test suffers from the drawback that, due to noise generation which is ascribable to current concentration, the test cannot be correlated with the normal operation, and that the parallel test deteriorates the characteristics of the semiconductor storage device. As an extreme case, even though the result of the parallel test by a tester, such as a memory tester, indicates "Fail", the result of a test with the normal operation on the same device indicates "PASS", thus raising the problem of reliability in the device testing. This problem becomes more outstanding the larger the number of the internal banks in the semiconductor storage device.

Accordingly, it is an object of the present invention to provide a semiconductor storage device having the function of suppressing current concentration, otherwise caused by the simultaneous activation of the plural banks in the parallel test, thus improving the test reliability.

The above and other objects are attained by a semiconductor storage device in accordance with one aspect of the present invention provides, comprising a plurality of banks each having a cell array, a command decoder for decoding an input command for outputting a decoded result, and a plurality of bank control circuits each provided for each of the banks and each configured for generating and outputting a control signal for the associated bank based on a bank activating signal output from the command decoder during the normal operation, wherein the semiconductor storage device further comprises means for performing control during parallel test in such a manner that the activation start timings of the banks will be offset from one bank to the next, based on the bank activating signal output from the command decoder and a signal output from at least one of the bank control circuits with a delay of a preset time as from the activation timing of the bank activating signal.

A semiconductor storage device, in accordance with another aspect of the present invention, comprises first to n'th banks, each having a cell array, n being a preset integer not less than 2, a command decoder for decoding an input command for outputting a decoded result, and first to n'th bank controlling circuits for generating and outputting control signals for the first to n'th banks. The command decoder simultaneously outputs first to n'th bank activating signals activating the first to n'th banks during a parallel test. The first bank controlling circuit generates the control signal for the first bank based on the first bank activating signal from the command decoder. The semiconductor storage device further comprises an i'th selection circuit associated with an (i+1)st bank control circuit, i being an integer not less than 1 and not larger than (n−1). The i'th selection circuit is supplied with a control signal for an i'th bank, output from an i'th bank controlling circuit, and with an (i+1)st bank activation signal, output from the command decoder. The i'th selection circuit selects and outputs the (i+1)st bank activation signal, output from the command decoder, during the normal operation, while selecting and outputting a control signal for an i'th bank, output from an i'th bank control circuit, as the (i+1)st bank activation signal, during the parallel test. The (i+1)st bank control circuit receives the (i+1)st bank activation signal output from the i'th selection circuit to generate a control signal for the (i+1)st bank.

The meritorious effects of the present invention are summarized as follows.

According to the present invention, the activation start timing of plural banks is offset to avoid the noise generation due to current concentration to improve the reliability of parallel test.

Moreover, according to the present invention, a signal for controlling a bank other than the bank of interest is selected by a selector circuit, and used as a delayed bank activation signal, by way of a circuit structure for offsetting the start timing of plural banks, thereby preventing the circuit area from increasing.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will now be described. A semiconductor storage device according to the present invention comprises first to n'th banks, where n is a preset integer not less than 2, a command decoder for decoding an input command to output a decoded result, and first to n'th bank controlling circuits for generating and outputting control signals for the first to n'th banks. The command decoder simultaneously outputs first to n'th bank activating signals activating the first to n'th banks during a parallel test. The first bank controlling circuit generates the control signal for the first bank based on the first bank activating signal from the command decoder. The semiconductor storage device further comprises an i'th selection circuit associated with an (i+1)st bank control circuit, where i is an integer not less than 1 and not larger than (n−1). The i'th selection circuit receives a control signal for an i'th bank, output from an i'th bank controlling circuit, and an (i+1)st bank activation signal, output from the command decoder. The i'th selection circuit selects and outputs the (i+1)st bank activation signal, output from the command decoder, during the normal operation, while selecting and outputting a control signal for an i'th bank, output from an i'th bank control circuit, as the (i+1)st bank activation signal, during the parallel test. The (i+1)st bank control circuit receives the (i+1)st bank activation signal output from the i'th selection circuit to generate a control signal for the (i+1)st bank.

Figure 1:
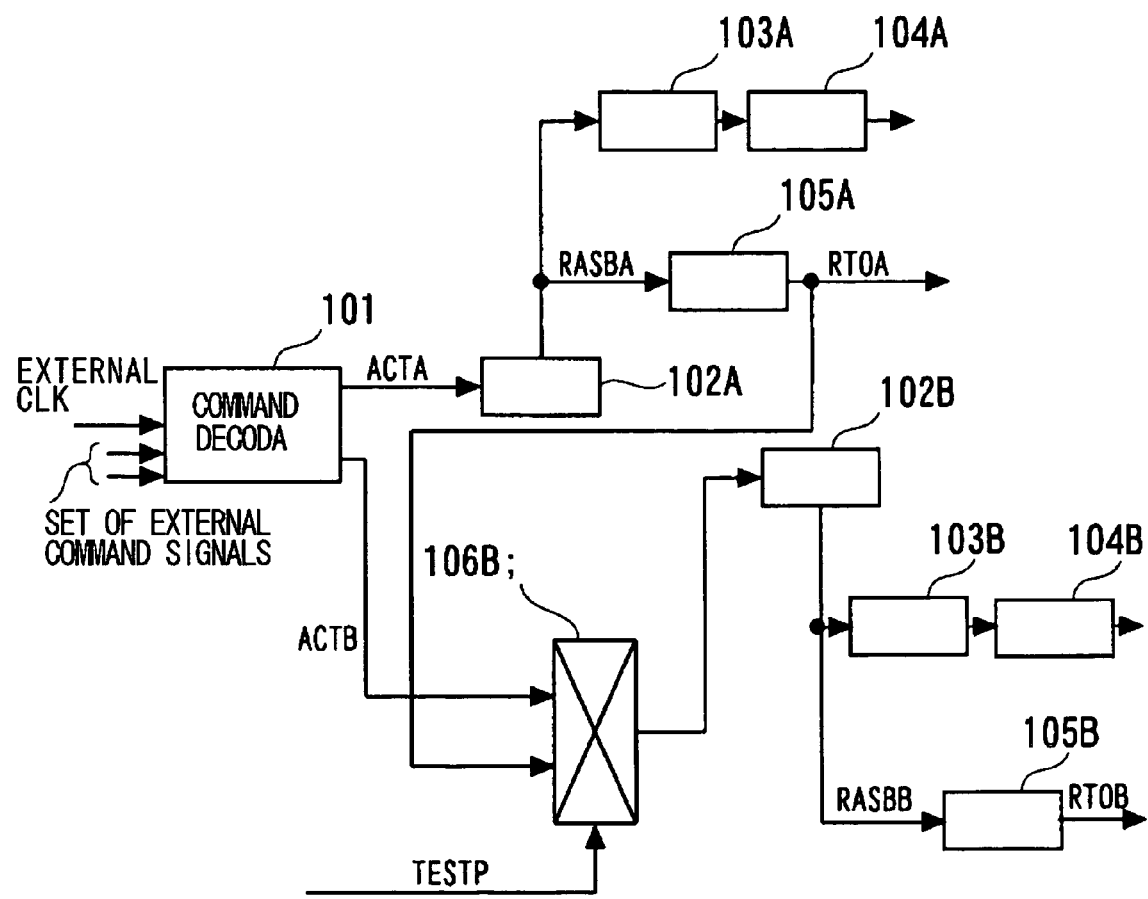
FIG. 1 is a diagram illustrating the configuration of an embodiment of the present invention.

In one embodiment of the present invention where n=2, the semiconductor storage device has A and B banks, each having a cell array. Referring to FIG. 1, the semiconductor storage device comprises:

a command decoder (101) which decodes an input command to output a decoded result, and which simultaneously outputs respective A and B bank activation signals (ACTA and ACTB) for activating the A and B banks, during a parallel test;

a set of A bank control circuits (102A–105A) which generate a control signal (RTOA) for the A bank, based on the A bank activating signal (ACTA);

a selection circuit (106B) which receives the B bank activation signal (ACTB) output from the command decoder and the control signal (RTOA) for the A bank, which selects and outputs the ACTB from the command decoder during the normal operation, and which selects and outputs the control signal (RTOA) for the A bank as the ACTB during the parallel test; and a set of B bank controlling circuits (102B–105B) which receive the signal ACTB output from the selection circuit (106B) to generate a control signal for the B bank.

In another embodiment of the present invention, where n=4, the semiconductor storage device comprises first to fourth banks, each having a cell array;

a command decoder which decodes an input command to output a decoded result, and which simultaneously output first to fourth bank activation signals for activating the first to fourth banks, during parallel test;

a first bank controlling circuit which generates a control signal for the first bank, based on the first bank activation signal;

a first selection circuit which receives the second bank activation signal output from the command decoder and the control signal for the first bank, output from the first bank controlling circuit, which selects and outputs the second bank activating signal during the normal operation and which selects and outputs the control signal for the first bank during the parallel test;

a second bank controlling circuit which receives a signal output from the first selection circuit as the second bank activating signal to generate a control signal for the second bank;

a second selection circuit which receives the third bank activation signal output from the command decoder and the control signal for the second bank, output from the second bank controlling circuit, which selects and outputs the third bank activating signal during the normal operation and which selects and outputs the control signal for the second bank during the parallel test;

a third bank controlling circuit which receives a signal output from the second selection circuit as the third bank activating signal to generate a control signal for the third bank;

a third selection circuit which receives the fourth bank activation signal output from the command decoder and the control signal for the third bank, output from the third bank controlling circuit, which selects and outputs the fourth bank activating signal during the normal operation and which selects and outputs the control signal for the third bank during the parallel test; and a fourth bank controlling circuit which receives a signal output from the third selection circuit as the fourth bank activating signal to generate a control signal for the fourth bank.

According to the present invention, the activation start timing of the plural banks is offset, at the time of the parallel test, as a test mode of testing plural banks simultaneously, such as to reduce the noise otherwise caused by current concentration, thereby improving the correlation of characteristics with respect to the normal operation. By generating a bank activating signal for a bank other than a bank in interest, in a set of bank control circuits, based on a control signal generated by a bank activating signal for the bank of interest, in place of delaying bank activation by a delay circuit, it is possible to suppress the increase in the circuit size.

Referring to the drawings, the embodiments of the present invention will be described in detail. FIG. 1 is a diagram showing the configuration of an embodiment of the present invention. In FIG. 1, 101 is a command decoder, 106B is a selector (selection circuit), 102A, 103A, 104A and 105A are ROW system circuit blocks for a block A and 102B, 103B, 104B and 105B are ROW system circuit blocks for a block B.

The command decoder 101 receives plural command signals (a set of external command signals) and a clock signal CLK supplied from outside the semiconductor storage device, and decodes the command signal to generate internal control signals. This command decoder 101 is similar in structure and operation to the command decoder 301, described with reference to FIG. 3.

The circuit blocks 102A and 102B are signal generating circuits which receives bank activating signals ACTA and ACTB, generated from the command decoder 101 respectively, to generate respective strobe signals RASBA and RASBB for activating internal ROW systems of the two banks. The present embodiment is of a two-bank structure, comprising a bank A and a bank B, with the signals ACTA and RASBA being generated in the activated state of the bank A and with the signals ACTB and RASBB being generated in the activated state of the bank B. In the case of a four-bank structure, similar circuit blocks may be provided, by way of extension, such that two circuit blocks 102C and 102D, not shown, generate RASBC and RASBD from ACTC and ACTD, respectively, for banks C and D, respectively. Although an instance of a two-bank structure is given herein, by way of convenience for explanation, the present invention may, of course, be applied to a semiconductor storage device having more than two banks.

The circuit blocks 103A and 105A receive the RASBA signal, activating the bank A, to generate needed control signals for the ROW system. Among the needed signals, there are for example a signal controlling an X-address (one-shot pulse signal for controlling the activation period of the selected word line) and a signal controlling an X-redundancy circuit, not shown.

In the present embodiment, the circuit block 105A controls the time for securing the restore level to a memory cell, not shown (the amount of electric charge in a cell). The signal output from the circuit block 105A is labeled RTOA.

With the circuit block 103A being an X-address control block, the circuit block 104A receives the X-address as an input to select a word line of the bank in interest.

The circuit block 102B is a control block of the bank B, associated with the circuit block 102A as the control block of the bank A.

A selector circuit 106B receives a B bank activation signal ACTB, output from the command decoder 101, the signal RTOA, output from the circuit block 105A, and a parallel test control signal TSETP, as a selection control signal. During the time of the normal operation (that is, other than the time of parallel test), the selector circuit 106B selects the B bank activating signal ACTB, output from the command decoder 101, and directly transmits the so selected signal to the B bank controlling block 102B When a selection control signal TESTP indicates a parallel test (test for simultaneously testing plural banks), the selector circuit 106B selects and outputs the signal RTOA output from the circuit block 105A. In the present embodiment, the parallel test control signal TESTP is used as a selection control signal for controlling the selection of the selector circuit 106B, and the logic design is so made that the parallel test control signal TSETP is activated by setting from an tester during parallel test to select the signal RTOA by the selector circuit 106B. During the normal operation, the signal TSETP is inactivated.

Figure 2:
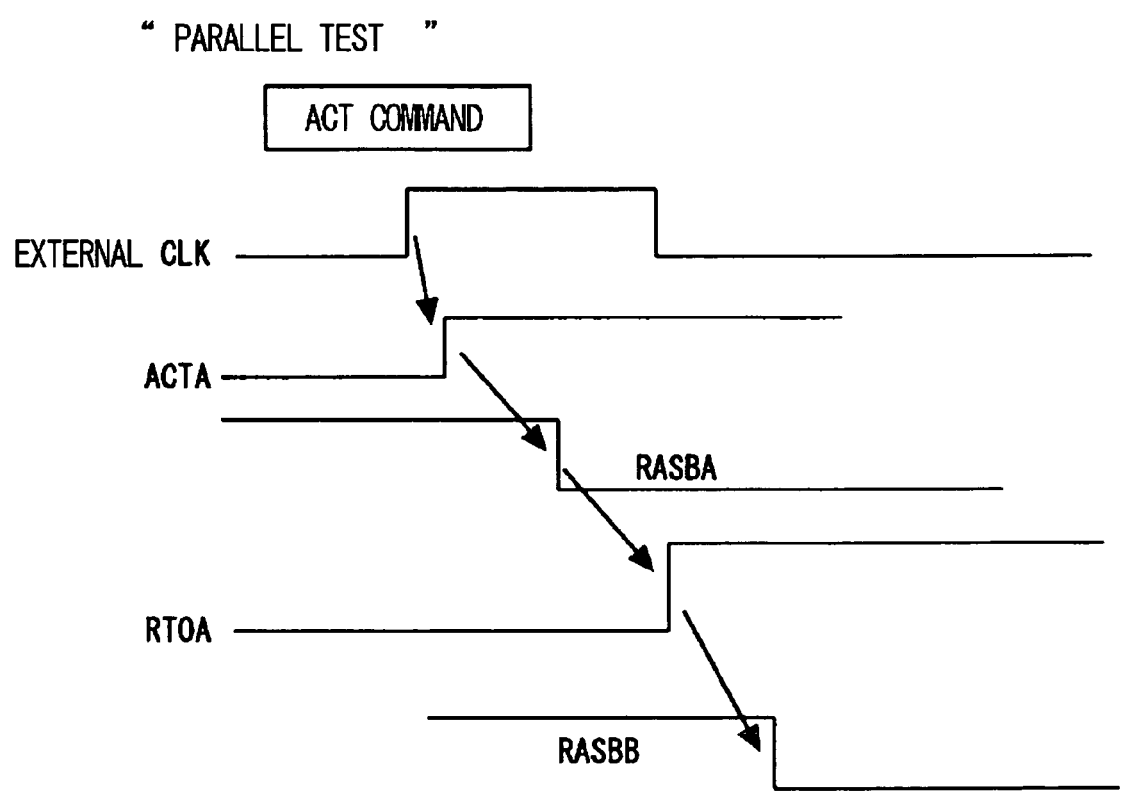
FIG. 2 is a timing diagram illustrating the operation of parallel test in an embodiment of the present invention.

FIG. 2 is a waveform diagram for illustrating an exemplary operation of the parallel test. In the present embodiment, the A bank activating signal ACTA is generated, during the parallel test, as during the normal operation, in synchronization with e.g. the rising transition of the clock signal CLK, supplied from outside the semiconductor storage device, as shown in FIG. 2. Based on the signal ACTA, the strobe signal RASBA is generated to activate the bank A. The circuit block 105A, controlling the bank A, is responsive to the transition (falling transition) of the strobe signal RASBA to output the signal RTOA (high level). The signal RTOA is entered to the selector 106B and selectively output to the circuit block 102B. From this circuit block 102B, the strobe signal RASBB is generated to activate the bank B. In the present embodiment, the activation timing of the bank A differs from that of the bank B, as shown in FIG. 2.

Figure 3:
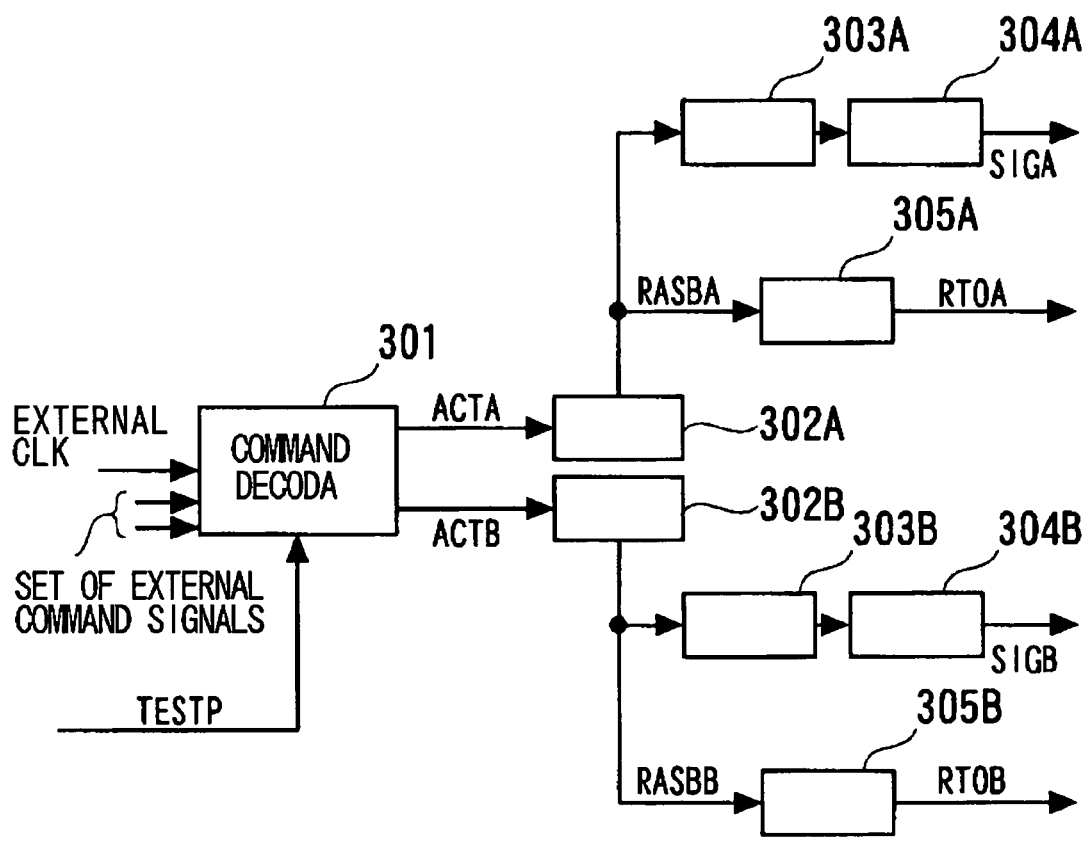
FIG. 3 is a diagram illustrating the configuration of a conventional semiconductor storage device.
Figure 4:
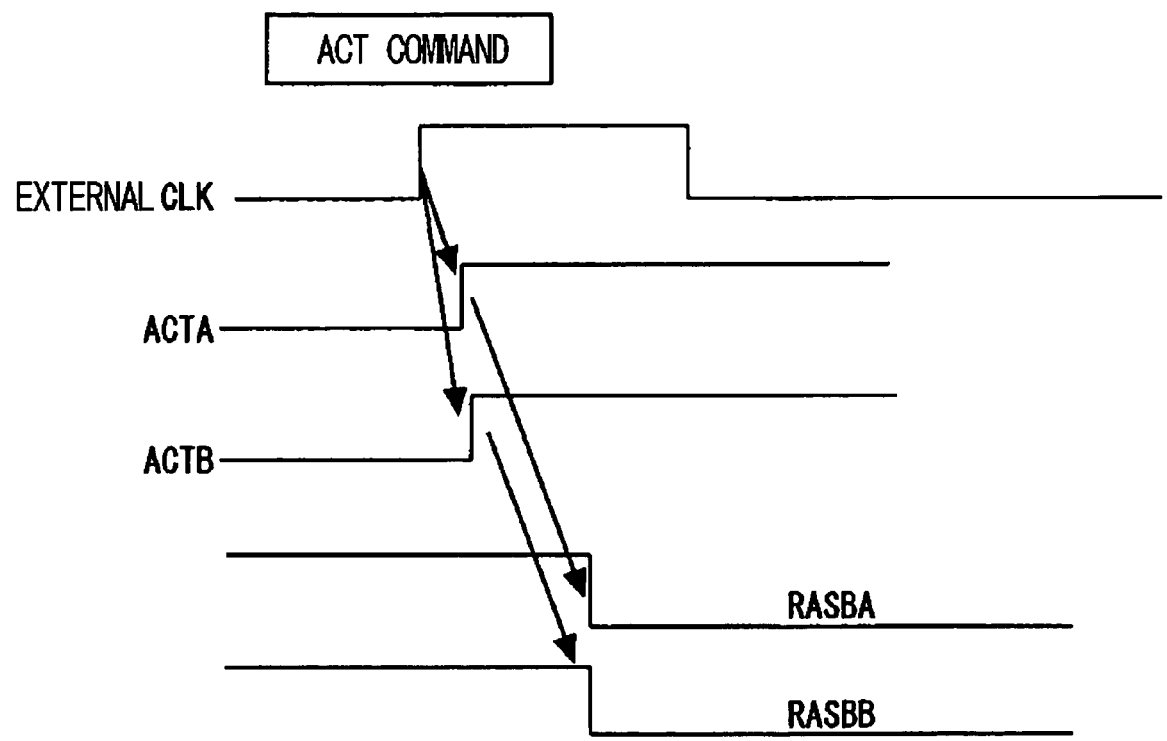
FIG. 4 is a timing diagram illustrating the operation of parallel test in a conventional semiconductor storage device.

That is, in the present embodiment, since the activation start timing for the bank A differs from that of the bank B, it is possible to evade the problem of current concentration caused by concurrent activation of the plural banks, explained with reference to FIG. 3, noise or deterioration in the operational reliability.

In the present embodiment, the signal RTOA, as one of the control signals for the bank A, is used in place of the activation signal ACTB for the bank B.

Referring to FIG. 1, the logic design may be so made that, instead of using the signal RTOA in place of the B bank activation signal ACTB, the command decoder 101 generates the signal ACTB after lapse of a preset delay after the generation of the signal ACTA during the parallel test. However, if this structure is used, a delay element, not used for the normal operation, is needed. The delay time as set is not insignificant, in order to avoid the current concentration, with the result that the area taken up by the delay element becomes larger to increase the chip area of the storage device.

In the present embodiment, the signal RTOA is used as a B bank activating signal ACTB. The signal RTOA is a signal generated after the lapse of a preset delay time as from the transition of the strobe signal RASBA in case the bank A is activated in the course of the normal operation. That is, in the present embodiment, since the signal RTOA is used as the B bank activation signal during parallel test, a selector may well be constructed with a simple structure.

In the present embodiment, the current concentration, otherwise caused by the plural banks becoming activated at the same time, may be prevented from occurring. Moreover, in the present embodiment, the circuit size may be prevented form increasing by shifting the activation start timing of the plural banks by taking advantage of the signal output form the circuit block used for the normal operation.

The present embodiment has been described, taking an example of a two-bank structure, as described above. However, the structure with four and other plural banks may be envisaged in similar manner.

In the four-bank structure for banks A to D, as an example, three selectors (selection circuits) of the previous embodiment are provided ahead of the banks B, C and D, the first selector receives the signal RTOA for A bank control and a B bank activating signal ACTB from the command decoder 101, the second selector receives the signal RTOB for B bank control and a C bank activating signal ACTC from the command decoder 101, and the third selector receives the signal RTOC for C bank control and a D bank activating signal ACTB from the command decoder 101. During the normal operation, the first to third selectors select and output B, C and D bank activation signals, respectively. During the parallel test, the first selector selects and outputs the signal RTOA for controlling the bank A, as ACTB for activating the bank B, the second selector selects and outputs the signal RTOB for controlling the bank B, as ACTC for activating the bank C and the third selector selects and outputs the signal RTOC for controlling the bank C, as ACTD for activating the bank D.

As a modification of the present embodiment, a signal SIGA, output from the circuit block 104A, may be supplied to the selector 106B to control the start of activation of the bank B.

As a further modification of the above embodiment, any other suitable signal, generated for activating the bank A, may be used. A signal well suited to the timing difference between activation of the bank A and that of the bank B is used. The selection of a signal supplied to the selector circuit 106B along with the bank B activating signal ACTB may be selected based on e.g. the result of simulation.

Or, the selector 106B may be designed as a three-input selector circuit (3-input 1-output circuit) which receives three inputs of ACTB, RTOA and SIGA, with the signal ACTB being selected and output for the normal operation and with one of the signals RTOA and SIGA being selected and output for the parallel test. It is noted that, as a selection control signal for the selector circuit, the RTOA or the SIGA, having an optimum delay time and optimum logical value, may be selected in this case based on a signal distinct from the TESPT, the value of which is set from the tester.

In the above embodiments, the strobe signals RASBA and RASBB are in an activated state at a low level. The present invention is, however, not limited to this structure. Moreover, the present invention is not limited to the clock synchronization DRAM and may be applied to the parallel test for an optional storage device with an optional number of banks. Although the present invention has so far been elucidated with reference to preferred embodiments, the present invention is not limited to the structure of the above embodiments and may comprise various changes or corrections that may be achieved by those skilled in the art within the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
  a plurality of banks, each having a cell array;
  a command decoder for decoding an input command to output a decoded result;
  a plurality of bank control circuits, each provided for each of said banks and each generating and outputting a control signal for the associated bank based on a bank activating signal output from said command decoder during normal operation; and
  a circuit for performing control during parallel test in such a manner that the start timings of activating said plural banks will be offset from one bank to the next, based on the bank activating signal output from said command decoder and a signal output from at least one of said bank control circuits with a delay of a preset time as from the activation timing of said bank activating signal.

2. A semiconductor storage device comprising:
  first to n'th banks, each having a cell array, n being a preset integer not less than 2;
  a command decoder for decoding an input command to output a decoded result; and
  first to n'th bank controlling circuits for generating and outputting control signals for said first to n'th banks respectively,
  said command decoder simultaneously outputting first to n'th bank activating signals activating said first to n'th banks during a parallel test,
  said first bank controlling circuit generating the control signal for said first bank based on said first bank activating signal from said command decoder;
  the semiconductor storage device further comprising
  an i'th selection circuit associated with an (i+1)st bank control circuit, i being an integer not less than 1 and not larger than (n−1),
  said i'th selection circuit receiving the control signal for an i'th bank, output from an i'th bank controlling circuit, and an (i+1)st bank activation signal, output from said command decoder,
  said i'th selection circuit selecting and outputting the (i+1)st bank activation signal, output from said command decoder, during the normal operation,
  said i'th selection circuit selecting and outputting a control signal for an i'th bank, output from an i'th bank control circuit, as the (i+1)st bank activation signal, during the parallel test;
  said (i+1)st bank control circuit, receiving said (i+1)st bank activation signal output from said i'th selection circuit and generating a control signal for the (i+1)st bank.

3. A semiconductor storage device comprising:
  first and second banks, each having a cell array;
  a command decoder for decoding an input command to output a decoded result,
  said command decoder simultaneously outputting first and second bank activation signal for activating said first and second banks, during a parallel test;
  a first bank control circuit, receiving said first bank activating signal output from said command decoder, and generating a control signal for said first bank;
  a selection circuit, receiving as inputs said second bank activation signal, output from said command decoder, and the control signal for said first bank, output from said first bank control circuit, selecting and outputting said second bank activating signal, during the normal operation, and selecting and outputting said first bank activating signal, during the parallel test; and
  a second bank controlling circuit, receiving a signal output from said selection circuit as a second bank activating signal, and generating a control signal for said second bank.

4. The semiconductor storage device according to claim 3, wherein
  said selection circuit receives a test control signal for controlling the parallel test, as a selection control signal, and selects and outputs one of the two input signals supplied to said selection circuit, based on the value of said selection control signal.

5. The semiconductor storage device according to claim 3, wherein
  the control signal for said first bank output from said first bank control circuit includes a signal controlling the activation of a selected word line of said first bank.

6. The semiconductor storage device according to claim 3, wherein
  said selection circuit receives, at an input terminal thereof, said second bank activation signal output from said command decoder, and receives, at a plurality of input terminals thereof, a plurality of control signals for said first bank, output from said first bank control circuit; and wherein said selection circuit selects and outputs said second bank activation signal, supplied to said input terminal, during the normal operation, and selects and outputs one of the control signals for said first bank, supplied to said plural input terminals, during the parallel test.

7. A semiconductor storage device comprising:

first to fourth banks, each having a cell array;

a command decoder for decoding an input command to output a decoded result, said command decoder simultaneously outputting first to fourth bank activation signals for activating said first to fourth banks, during parallel test;

a first bank controlling circuit, receiving said first bank activation signal output from said command decoder, and generating a control signal for said first bank;

a first selection circuit, receiving said second bank activation signal, output from said command decoder, and the control signal for said first bank, output from said first bank controlling circuit, selecting and outputting said second bank activating signal, during the normal operation, and selecting and outputting said control signal for said first bank, during the parallel test;

a second bank controlling circuit, receiving a signal output from said first selection circuit as a second bank activating signal, and generating a control signal for the second bank;

a second selection circuit, receiving said third bank activation signal, output from said command decoder, and the control signal for said second bank, output from said second bank controlling circuit, selecting and outputting said third bank activating signal, during the normal operation, and selecting and outputting said control signal for said second bank, during the parallel test;

a third bank controlling circuit, receiving a signal output from said second selection circuit as a third bank activating signal, and generating a control signal for the third bank;

a third selection circuit, receiving said fourth bank activation signal, output from said command decoder, and the control signal for said third bank, output from said third bank controlling circuit, selecting and outputting said fourth bank activating signal, during the normal operation, and selecting and outputting said control signal for said third bank, during the parallel test; and a fourth bank controlling circuit, receiving a signal output from said third selection circuit as a fourth bank activating signal, and generating a control signal for the fourth bank.

8. The semiconductor storage device according to claim 1, wherein said command decoder outputs a bank activating signal for a specified bank during the normal operation.

9. The semiconductor storage device according to claim 2, wherein said command decoder outputs a bank activating signal for a specified bank during the normal operation.

10. The semiconductor storage device according to claim 3, wherein said command decoder outputs a bank activating signal for a specified bank during the normal operation.

11. The semiconductor storage device according to claim 7, wherein said command decoder outputs the bank activating signal for a specified bank during the normal operation.

12. The semiconductor storage device according to claim 1, wherein said bank activating signal is output in synchronization with the rise or fall transition of a clock signal for synchronization from said command decoder.

13. The semiconductor storage device according to claim 2, wherein said bank activating signal is output in synchronization with the rise or fall transition of a clock signal for synchronization from said command decoder.

14. The semiconductor storage device according to claim 3, wherein said bank activating signal is output in synchronization with the rise or fall transition of a clock signal for synchronization from said command decoder.

15. The semiconductor storage device according to claim 7, wherein said bank activating signal is output in synchronization with the rise or fall transition of a clock signal for synchronization from said command decoder.

* * * * *